(12) United States Patent
Cho et al.

(10) Patent No.: US 11,087,653 B2
(45) Date of Patent: Aug. 10, 2021

(54) INSPECTION SYSTEM AND METHOD OF INSPECTING A DISPLAY CELL USING THE SAME

(71) Applicant: Samsung Display Co., Ltd., Yongin-si (KR)

(72) Inventors: Dae Youn Cho, Yongin-si (KR); Hyunho Kim, Cheonan-si (KR); Hyojung Kim, Goyang-si (KR); Young-Joo Noh, Anyang-si (KR); Jongwoo Park, Seongnam-si (KR); Ju Hee Lee, Asan-si (KR); Jinwoo Chae, Anyang-si (KR); Youngtae Choi, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 162 days.

(21) Appl. No.: 16/522,279

(22) Filed: Jul. 25, 2019

(65) Prior Publication Data

US 2020/0035136 A1 Jan. 30, 2020

(30) Foreign Application Priority Data

Jul. 27, 2018 (KR) .................. 10-2018-0087548

(51) Int. Cl.
*G09G 3/00* (2006.01)
*G01R 31/26* (2020.01)
*G09G 3/20* (2006.01)
*G09G 3/3225* (2016.01)

(52) U.S. Cl.
CPC ......... *G09G 3/006* (2013.01); *G01R 31/2635* (2013.01); *G09G 3/2007* (2013.01); *G09G 3/3225* (2013.01)

(58) Field of Classification Search
CPC ....................................................... G09G 3/006
USPC ........................................................ 345/690
See application file for complete search history.

(56) References Cited

U.S. PATENT DOCUMENTS

| 9,595,213 | B2 | 3/2017 | Kim | |
|---|---|---|---|---|
| 2008/0054798 | A1* | 3/2008 | Jeong | G09G 3/3233 313/504 |
| 2009/0201042 | A1* | 8/2009 | Sellathamby | H01L 27/1214 324/754.29 |

(Continued)

FOREIGN PATENT DOCUMENTS

| KR | 10-0539290 B1 | 12/2005 |
|---|---|---|
| KR | 10-0749467 B1 | 8/2007 |

*Primary Examiner* — David T Welch
(74) *Attorney, Agent, or Firm* — Lewis Roca Rothgerber Christie LLP

(57) ABSTRACT

An inspection system for a display cell having a display part and a plurality of data lines connected to first and second pixel units of the display part. An array test part and a lighting test part are located in a peripheral area around the display part. An inspection apparatus is configured to provide the array test part with an array control signal to block an array data signal from being applied to a plurality of data lines in a period in which a white image is displayed and to provide the lighting test part with a lighting control signal to block a lighting data signal from being applied to a plurality of data lines during a period in which a black image is displayed, during a drive reliability test mode for displaying a test image including the black image and the white image.

20 Claims, 8 Drawing Sheets

(56) References Cited

U.S. PATENT DOCUMENTS

| | | | | |
|---|---|---|---|---|
| 2011/0043500 A1* | 2/2011 | Kwak | .................... | G09G 3/006 |
| | | | | 345/206 |
| 2011/0080173 A1* | 4/2011 | Kim | ..................... | G09G 3/006 |
| | | | | 324/403 |
| 2014/0354285 A1* | 12/2014 | Kim | .................... | G09G 3/3233 |
| | | | | 324/414 |
| 2014/0354286 A1* | 12/2014 | Kim | ..................... | G09G 3/006 |
| | | | | 324/414 |

* cited by examiner

INSPECTION SYSTEM AND METHOD OF INSPECTING A DISPLAY CELL USING THE SAME

CROSS REFERENCE TO RELATED APPLICATION

This application claims priority to and the benefit of Korean Patent Application No. 10-2018-0087548 filed on Jul. 27, 2018, which is hereby incorporated by reference for all purposes as if fully set forth herein.

BACKGROUND

1. Field

Exemplary embodiments of the inventive concept relate to an inspection system and a method of inspecting a display cell. More particularly, exemplary embodiments of the inventive concept relate to an inspection system for performing a driver reliability test of a display cell and a method of inspecting a display cell using the inspection system.

2. Description of the Related Art

Recently, various flat panel display devices having reduced weight and volume in comparison to a Cathode Ray Tube (CRT) have been developed. The flat panel display devices include a liquid crystal display (LCD) device, a field emission display (FED) device, a plasma display panel (PDP), an organic light emitting display (OLED) device, etc.

The OLED device has features such as rapid response speed and low power consumption because the OLED device displays an image using organic light emitting diodes that emit light based on recombination of electrons and holes.

The OLED device includes an OLED panel. OLED panels are tested by performing a lighting test to inspect an electrical defect and an array test to inspect a lighting defect in the display cell state before a module process.

After the array test and the lighting test, the module process is performed. In the module process, a polarizing plate, a protective film, and a flexible circuit board on which a drive chip is mounted are attached to the OLED panel.

After the module process, the OLED device displays a reliability test image for a reliability evaluation because it is possible to control the data voltage for each pixel. Various drive reliability evaluations are preformed such as a high-temperature evaluation, a life evaluation and an afterimage evaluation.

SUMMARY

Exemplary embodiments of the inventive concept provide an inspection system for performing a driver reliability test of a display cell.

Exemplary embodiments of the inventive concept provide a method of inspecting a display cell using the inspection system.

According to an exemplary embodiment of the inventive concept, there is provided an inspection system for a display cell having an inspection apparatus. The display cell may include a display part including a first pixel unit and a second pixel unit adjacent to the first pixel unit and a plurality of data lines connected to the first and second pixel units, an array test part disposed in a peripheral area around the display part and configured to provide the plurality of data lines with an array data signal based on an array control signal, and an lighting test part disposed in the peripheral area and configured to provide the plurality of data lines with a lighting data signal based on a lighting control signal. The inspection apparatus may be configured to provide the array test part with an array control signal to block the array data signal from being applied to the plurality of data lines in a period in which a white image is displayed and to provide the lighting test part with a lighting control signal to block the lighting data signal from being applied to the plurality of data lines during a period in which a black image is displayed, during a drive reliability test mode for displaying a test image including the black image and the white image.

In an exemplary embodiment, each of the first pixel unit and the second pixel unit may include a first sub-pixel, a second sub-pixel, a third sub-pixel and a fourth sub-pixel, the first and second sub-pixels of the first pixel unit are connected to a first data line, the third and fourth sub-pixels of the first pixel unit are connected to a second data line, the first and second sub-pixels of the second pixel unit are connected to a third data line, and the third and fourth sub-pixels of the second pixel unit are connected to a fourth data line In an exemplary embodiment, the array test part may include an array control line configured to transfer an array control signal, a first array test line configured to transfer a first array data signal, a second array test line configured to transfer a second array data signal, first and second array transistors configured to transfer the first array data signal to the first and second data lines in response to the array control signal, and third and fourth array transistors configured to transfer the second array data signal to the third and fourth data lines in response to the array control signal.

In an exemplary embodiment, the first sub-pixel may be configured to emit light having a first color, a second sub-pixels may be configured to emit light of a second color, and the third and fourth sub-pixels may be configured to emit light of a third color.

In an exemplary embodiment, the lighting test part may include a first lighting control line configured to transfer a first lighting control signal, a second lighting control line configured to transfer a second lighting control signal, a third lighting control line configured to transfer a third lighting control signal, a first lighting test line configured to transfer a first lighting data signal, a second lighting test line configured to transfer a second lighting data signal, a third lighting test line configured to transfer a third lighting data signal, a first lighting transistor configured to transfer the first lighting data signal to the first data line in response to the first lighting control signal, a second lighting transistor configured to transfer the second lighting data signal to the first data line in response to the second lighting control signal, and a third lighting transistor configured to transfer the third lighting data signal to the second data line in response to the third lighting control signal.

In an exemplary embodiment, in a period for displaying the white image, the array control signal maintains a turn-off voltage for turning off the array transistors, the first lighting control signal may alternately repeat a turn-on voltage for turning on the lighting transistor and a turn-off voltage for turning off the lighting transistor, the second lighting control signal may alternately repeat the turn-on voltage and the turn-off voltage opposite to the first lighting control signal, and the third lighting control signal may maintain the turn-on voltage.

In an exemplary embodiment, in a period displaying the black image, the array control signal may maintain the turn-on voltage for turning on the array transistor, and the first, second and third lighting control signals may maintain the turn-off voltage for turning off the lighting transistor.

In an exemplary embodiment, the array data signal may be a black data voltage of a black grayscale level, and the first, second and third lighting data signals may be different color data voltages of a white grayscale level.

In an exemplary embodiment, the system may further include a fan-out part disposed in the peripheral area of the display cell, disposed between the array test part and the lighting test part and having a plurality of data pads connected to a plurality of data lines; and a selection control part disposed between the fan-out part and the lighting test part.

In an exemplary embodiment, the selection control part may include a first selection control line configured to receive a first selection control signal from the inspection system, a second selection control line configured to receive a second selection control signal from the inspection system, a first selection transistor that connects the data pad to an odd-numbered data line in response to the first selection control signal, and a second selection transistor that connects the data pad to an even-numbered data line in response to the second selection control signal.

In an exemplary embodiment, in a period displaying the white image, the first and second selection control signals may maintain a turn-off voltage for turning off the selection transistor.

In an exemplary embodiment, in a period displaying the black image, the first and second selection control signals may maintain a turn-on voltage for turning on the selection transistor.

In an exemplary embodiment, the system may further include an array test pad part configured to receive the array control signal, the first array test signal, and the second array test signal, a lighting test pad part configured to receive the first, second, and third lighting control signals and the first, second, and third lighting data signals and a cutting part disposed between the array test part and the array test pad part and disposed between the lighting test part and the lighting test pad part.

According to an exemplary embodiment of the inventive concept, there is provided method of method of inspecting a display cell which comprises a display part including a first pixel unit and a second pixel unit adjacent to the first pixel unit and a plurality of data lines connected to the first and second pixel units, an array test part disposed in a peripheral area around the display part and configured to provide the plurality of data lines with an array data signal based on an array control signal, and an lighting test part disposed in the peripheral area and configured to provide the plurality of data lines with a lighting data signal based on a lighting control signal. The method may include in a drive reliability test mode for displaying a test image including a black image and the white image, providing the array test part with an array control signal to block the array data signal from being applied to the plurality of data lines in a period in which the white image is displayed and providing the lighting test part with a lighting control signal to block the lighting data signal from being applied to the plurality of data lines in a period in which the black image is displayed.

In an exemplary embodiment, the method may further include applying the lighting data signal to the plurality of data lines in a period for displaying the white image and applying the array data signal to the plurality of data lines in a period for displaying the black image.

In an exemplary embodiment, the array test part comprises an array control line configured to transfer an array control signal, a first array test line configured to transfer a first array data signal, a second array test line configured to transfer a second array data signal, first and second array transistors configured to transfer the first array data signal to the first and second data lines in response to the array control signal, and third and fourth array transistors configured to transfer the second array data signal to the third and fourth data lines in response to the array control signal, wherein in a period for displaying the white image, the array control signal may maintain a turn-off voltage for turning off the first, second, third, and forth array transistors, and in a period for displaying the black image, the array control signal may maintain a turn-on voltage for turning on the first, second, third, and forth array transistors.

In an exemplary embodiment, the first sub-pixels may be configured to emit light having a first color and second sub-pixels may be configured to emit light having a second color, and the third and fourth sub-pixels may be configured to emit light of a third color.

In an exemplary embodiment, the lighting test part comprises a first lighting control line configured to transfer a first lighting control signal, a second lighting control line configured to transfer a second lighting control signal, a third lighting control line configured to transfer a third lighting control signal, a first lighting test line configured to transfer a first lighting data signal, a second lighting test line configured to transfer a second lighting data signal, a third lighting test line configured to transfer a third lighting data signal, a first lighting transistor configured to transfer the first lighting data signal to the first data line in response to the first lighting control signal, a second lighting transistor configured to transfer the second lighting data signal to the first data line in response to the second lighting control signal, and a third lighting transistor configured to transfer the third lighting data signal to the second data line in response to the third lighting control signal, wherein in the period for displaying the white image, the first lighting control signal may alternately repeat a turn-on voltage for turning on the lighting transistor and a turn-off voltage for turning off the lighting transistor, the second lighting control signal may alternately repeat the turn-on voltage and the turn-off voltage opposite to the first lighting control signal, and the third lighting control signal may maintain the turn-on voltage, and wherein in the period for displaying the black image, the first, second and third lighting control signals may maintain the turn-off voltage for turning off the lighting transistor.

In an exemplary embodiment, in an array test mode, the array control signal may maintain the turn-on voltage for turning on the array transistors, and the plurality of data lines may be configured to receive the first and second array data signals by turning on the array transistors.

In an exemplary embodiment, in a lighting test mode, the first lighting control signal may alternately repeat the turn-on voltage for turning on the lighting transistor and the turn-off voltage for turning off the lighting transistor, the second lighting control signal may alternately repeat the turn-on voltage and the turn-off voltage opposite to the first lighting control signal, and the third lighting control signal may maintain the turn-on voltage, and the plurality of data lines may be configured to receive the first, second and third lighting data signals by turning on the first, second and third lighting transistors.

According to the inventive concept, in the display cell state, the drive reliability test is performed using the array test signal and the lighting test signal, thereby simplifying the inspection process and reducing the manufacturing cost.

BRIEF DESCRIPTION OF THE DRAWINGS

The above and other features and aspects of the inventive concept will become more apparent by describing in detailed exemplary embodiments thereof with reference to the accompanying drawings, in which.

DETAILED DESCRIPTION

Figure 1:
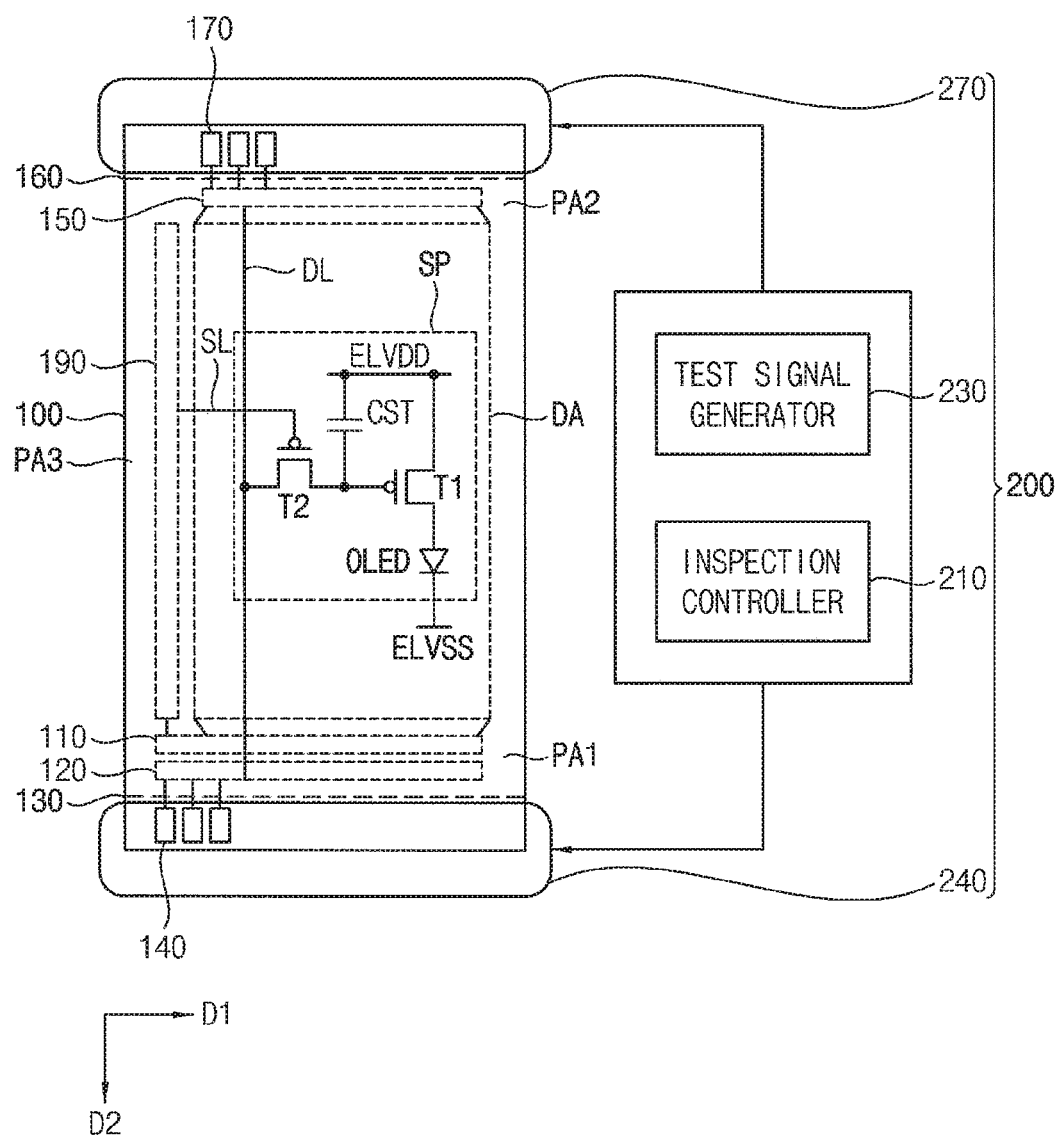
FIG. 1 is a block diagram illustrating a display cell coupled to an inspection system according to one exemplary embodiment.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein. FIG. 1 is a block diagram illustrating a display cell coupled to an inspection system according to one exemplary embodiment.

Referring to FIG. 1, the inspection system may include a display cell 100 and an inspection system 200.

The display cell 100 may include a display part DA and a plurality of peripheral areas around (e.g., surrounding) the display part DA.

The display part DA may include a plurality of data lines DL, a plurality of scan lines SL and a plurality of sub pixels SP.

The plurality of data lines DL are arranged along a first direction D1, and each data line DL extends in a second direction D2 crossing the first direction D1.

The plurality of scan lines SL are arranged along the second direction D2 and each scan line SL extends in the first direction D1.

The plurality of sub pixels SP are arranged in a matrix form including a plurality of pixel rows and a plurality of pixel columns. Each sub-pixel SP includes an organic light-emitting diode OLED and driving elements for driving the organic light-emitting diode OLED. For example, the sub-pixel SP includes the organic light-emitting diode OLED, a driving transistor T1, a switching transistor T2, and a storage capacitor CST.

The organic light-emitting diode OLED includes an anode electrode connected to the driving transistor T1 and a cathode electrode that receives a second power source voltage ELVSS The driving transistor T1 includes a control electrode connected to the switching transistor T2, a first electrode for receiving a first power source voltage ELVDD, and a second electrode connected to the anode electrode.

The switching transistor T2 includes a control electrode connected to the scan line SL, a first electrode connected to a data line and a second electrode connected to the control electrode of the driving transistor T1

The plurality of peripheral areas may include a first peripheral area PA1, a second peripheral area PA2, and a third peripheral area PA3.

The first peripheral area PA1 may be defined in an area adjacent to the first end of the data line DL. The first peripheral area PA1 includes a fan-out part 110, an array test part 120, a first cutting part 130 and an array test pad part 140.

The fan-out part 110 includes a plurality of data pads PD1, PD2, PD3 and PD4 (e.g., see FIG. 2) connected to a flexible circuit board including a driving chip in a module process.

The array test part 120 provides an array data signal to the plurality of data lines DL based on an array control signal provided from the inspection apparatus 200.

The first cutting part 130 is the area cut through the cutting process before the module process. The first cutting part 130 is electrically isolated from the array test pad part 140 and the array test part 120 through the cutting process.

The array test pad part 140 is connected to the array test part 120 and receives array control signal and array data signals provided from the inspection apparatus 200.

The second peripheral area PA2 may be defined in an area adjacent to the second end facing the first end of the data line DL. In the second peripheral area PA2, a lighting test part 150, a second cutting part 160 and a lighting test pad part 170 are arranged.

The lighting test part 150 provides a lighting data signal to the plurality of data lines DL based on the lighting control signal provided by the inspection apparatus 200.

The second cutting part 160 is the area cut through the cutting process before the module process. The second cutting part 160 is electrically isolated from the lighting test pad part 170 and the lighting test part 150 through a cutting process.

The lighting test pad part 170 is connected to the lighting test part 150 and receives the lighting control signal and the lighting data signal provided from the inspection apparatus 200.

The inspection system 200 includes an inspection controller 210, a test signal generator 230, a first test signal output part 240, and a second test signal output part 270.

The inspection controller 210 controls the test signal generator 230 to generate a test signal corresponding to a plurality of test modes.

The test signal generator 230 generates a test signal corresponding to the test mode.

For example, the test signal generator 230 generates an array test signal for the array test. The array test signal includes an array data signal and an array control signal that controls to turn-on and turn-off of a plurality of array transistors included in the array test part 120. For example, the array data signal may be a black data voltage of a black grayscale level (or black grey level) with a high voltage level (e.g., when the transistor included in the sub-pixel is a P-type transistor as shown in FIG. 1).

For example, the test signal generator 230 generates a lighting test signal for the lighting test. The lighting test signal includes a lighting data signal of a grayscale level (e.g., a specific or predetermined grayscale level) to cause the organic light-emitting diode OLED to emit a corresponding light and a lighting control signal to control to turn-on and turn-off of a plurality of lighting transistors included in the lighting test part 150. The lighting data signal may be a color data voltage of a white grayscale level.

For example, the test signal generator 230 generates the array data signal and the lighting data signal and generates the lighting control signal and the array control signal for the drive reliability test.

For the drive reliability test, the display part DA of the display cell 100 displays a reliability test image. For example, the reliability test image may include a white image and a black image.

In some embodiments, the array control signal for the reliability test blocks the array data signal from being applied to the plurality of data lines during a period in which the white image is displayed of the frame period in which the reliability test image is displayed. The lighting control signal for the reliability test blocks the lighting data signal from being applied to the plurality of data lines during a period in which the black image is displayed of the frame period in which the reliability test image is displayed.

The third peripheral area PA3 may be defined in an area adjacent to an end of the scan line SL. In the third peripheral area PA3, a scan driving circuit that generates a plurality of scan signals provided to the plurality of scan lines SL may be integrated.

Figure 2:
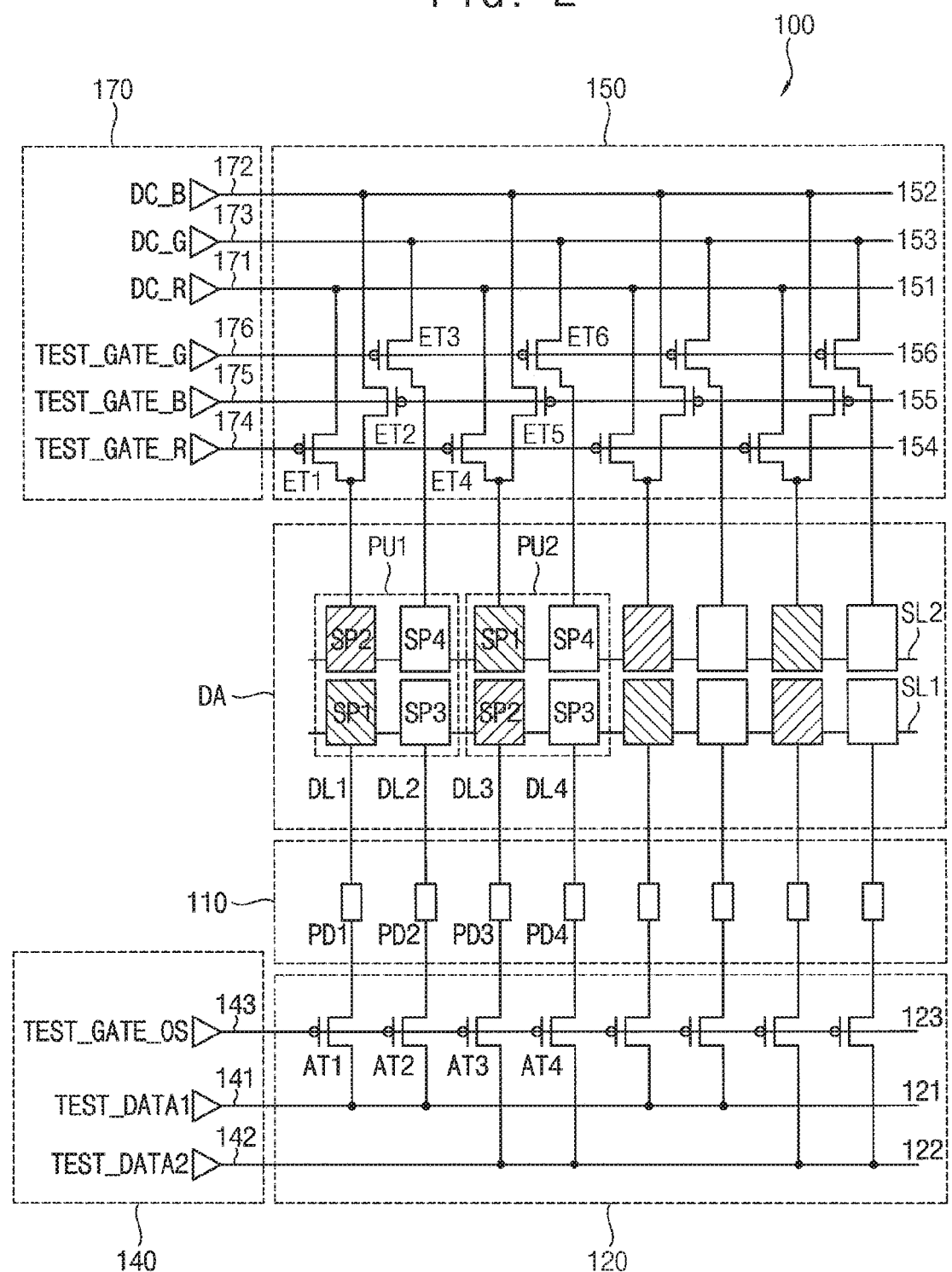
FIG. 2 is a conceptual diagram illustrating a display cell according to one exemplary embodiment.

FIG. 2 is a conceptual diagram illustrating a display cell to be inspected by the inspection system according to one exemplary embodiment.

Referring to FIGS. 1 and 2, the display cell 100 may include a display part DA, a fan-out part 110, an array test part 120, an array test pad part 140, a lighting test part 150 and a lighting test pad part 170.

The display part DA may include a plurality of pixel units PU1 and PU2.

For example, the display part may include the first pixel unit PU1 and the second pixel unit PU2 adjacent to the first pixel unit PU1 in the scan line direction.

The first pixel unit PU1 has a sub-sampled structure. For example, the first pixel unit PU1 may have a Pentile® structure (Pentile® is a registered trademark of Samsung Display Co. Ltd.) including a first sub-pixel SP1, a second sub pixel SP2, a third sub-pixel SP3, and a fourth sub-pixel SP4.

The first sub-pixel SP1 of the first pixel unit PU1 is connected to the first data line DL1 and the first scan line SL1, and may be a red pixel configured to emit red-light.

The second sub-pixel SP2 of the first pixel unit PU1 is connected to the first data line DL1 and the second scan line SL2, and may be a blue pixel configured to emit blue-light.

The third sub-pixel SP3 of the first pixel unit PU1 is connected to the second data line DL2 and the first scan line SL1, and may be the first green pixel configured to emit green-light.

The fourth sub-pixel SP4 of the first pixel unit PU1 is connected to the second data line DL2 and the second scan line SL2 and may be a second green pixel configured to emit green-light.

The second pixel unit PU2 has a Pentile® structure including a first sub-pixel SP1, a second sub-pixel SP2, a third sub-pixel SP3, and fourth sub-pixel SP4.

The first sub-pixel SP1 of the second pixel unit PU2 is connected to the third data line DL3 and the first scan line SL1, and may be a red pixel configured to emit red-light.

The second sub-pixel SP2 of the second pixel unit PU2 is connected to the third data line DL3 and the second scan line SL2, and may be a blue pixel configured to emit blue-light.

The third sub-pixel SP3 of the second pixel unit PU2 is connected to the fourth data line DL4 and the first scan line SL1, and may be a first green pixel configured to emit green-light.

The fourth sub-pixel SP4 of the second pixel unit PU2 is connected to the fourth data line DL2 and the second scan line SL2 and may be a second green pixel configured to emit green-light.

The fan-out part 110 includes a plurality of data pads PD1, PD2, PD3 and PD4 respectively connected to the plurality of data lines DL1, DL2, DL3 and DL4.

The array test part 120 includes a first array test line 121, a second array test line 122, an array control line 123 and a plurality of array transistors AT1, AT2, AT3 and AT4.

The first array test line 121 transfers the first array data signal TEST_DATA1 to the first and second data lines DL1 and DL2 connected to an odd-numbered pixel unit PU1.

The second array test line 122 transfers the second array data signal TEST_DATA2 to the third and fourth data lines DL3 and DL4 connected to an even-numbered pixel unit PU2.

The array control line 123 transfers an array control signal TEST_GATE_OS that includes a turn-on voltage and a turn-off voltage for turning on and turning off the plurality of array transistors AT1, AT2, AT3 and AT4.

The first array transistor AT1 includes a control electrode connected to the array control line 123, a first electrode connected to the first array test line 121, and a second electrode connected to the first data pad PD1.

The second array transistor AT2 includes a control electrode connected to the array control line 123, a first electrode connected to the first array test line 121, and a second electrode connected to the second data pad PD2.

The third array transistor AT3 includes a control electrode connected to the array control line 123, a first electrode connected to the second array test line 122, and a second electrode connected to the third data pad PD3.

The fourth array transistor AT4 includes a control electrode connected to the array control line 123, a first electrode connected to the second array test line 122, and a second electrode connected to the fourth data pad PD4.

The array test pad part 140 includes a first array test pad 141, a second array test pad 142, and an array control pad 143, and is connected to a first test signal output part 240 to receive an array test signal.

The first array test pad 141 receives the first array data signal TEST_DATA1. The first array data signal TEST_DATA1 may be the voltage (e.g., a black data voltage) of a black grayscale level.

The second array test pad 142 receives the second array data signal TEST_DATA2. The second array data signal TEST_DATA2 may be the voltage (e.g., a black data voltage) of a black grayscale level.

The array control pad 143 receives the array control signal TEST_GATE_OS. The array control signal TEST_GATE_OS may be set differently in an array test mode and a drive reliability mode.

For example, in the array test mode, the array control signal TEST_GATE_OS may be a direct current signal that maintains the turn-on voltage for turning on the plurality of array transistors AT1, AT2, AT3 and AT4.

In the drive reliability test mode, a reliability test image is displayed. The reliability test image includes a white image and a black image. The array control signal TEST_GATE_OS may have a direct current signal that maintains the turn-off voltage for the plurality of array transistors AT1, AT2, AT3 and AT4 during the period in which the white image is displayed and a direct current signal that maintains the turn-on voltage for the plurality of array transistors AT1, AT2, AT3 and AT4 during the period in which the black image is displayed.

The lighting test part 150 includes a first lighting test line 151, a second lighting test line 152, a third lighting test line 153, a first lighting control line 154, a second lighting control line 155, a third lighting control line 156 and a plurality of lighting transistors ET1, ET2, ET3, ET4, ET5 and ET6.

The first lighting test line 151 transmits the first lighting data signal DC_R to the odd-numbered data lines DL1 and DL3 among the plurality of data lines.

The second lighting test line 152 transmits the second lighting data signal DC_B to the odd-numbered data lines DL1 and DL3 of the plurality of data lines.

The third lighting test line 153 transmits the third lighting data signal DC_G to the even-numbered data lines DL2 and DL4 among the plurality of data lines.

The first lighting control line 154 connects a (3k−2)-th lighting transistor (e.g., ET1 and ET4) to a first lighting control signal TEST_GATE_R which controls the lighting transistors to turn-on and turn-off (where, k is a natural number such as 1, 2, 3 . . . ).

The second lighting control line 155 connects a (3k−1)-th lighting transistor (e.g., ET2 and ET5) to a second lighting control signal TEST_GATE_B which controls the lighting transistors to turn-on and turn-off.

The third lighting control line 156 connects a 3k-th lighting transistor (e.g., ET3 and ET6) to a third lighting control signal TEST_GATE_G which the lighting transistors to turn-on and turn-off.

The first lighting transistor ET1 includes a control electrode connected to the first lighting control line 154, a first electrode connected to the first lighting test line 151, and a second electrode connected to the first data line DL1.

The second lighting transistor ET2 includes a control electrode connected to the second lighting control line 155, a first electrode connected to the second lighting test line 152, and a second electrode connected to the first data line DL1.

The third lighting transistor ET3 includes a control electrode connected to the third lighting control line 156, a first electrode connected to the third lighting test line 153, and a second electrode connected to the second data line DL2.

The fourth lighting transistor ET4 includes a control electrode connected to the first lighting control line 154, a first electrode connected to the first lighting test line 151, and a second electrode connected to the third data line DL3.

The fifth lighting transistor ET5 includes a control electrode connected to the second lighting control line 155, a first electrode connected to the second lighting test line 152, and a second electrode connected to the third data line DL3.

The sixth lighting transistor ET6 includes a control electrode connected to the third lighting control line 156, a first electrode connected to the third lighting test line 153, and a second electrode connected to the fourth data line DL4.

The lighting test pad part 170 includes a first light test pad 171, a second light test pad 172, a third light test pad 173, a first lighting control pad 174, a second lighting control pad 175 and a third lighting control pad 176.

The first light test pad 171 receives the first lighting data signal DC_R. The first lighting data signal DC_R may be a red data voltage of a white grayscale level.

The second light test pad 172 receives the second lighting data signal DC_B. The second lighting data signal, DC_B, may be the blue data voltage of a white grayscale level.

The third light test pad 173 receives the third lighting data signal DC_G. The third lighting data signal DC_G may be the green data voltage of a white grayscale level.

The first lighting control pad 174 may receive a first lighting control signal TEST_GATE_R that includes a turn-on voltage and a turn-off voltage for the (3k−2)-th lighting transistors ET1 and ET4.

In the lighting test mode, the first lighting control signal TEST_GATE_R has an alternating signal that alternates between the turn-on voltage and the turn-off voltage.

In a drive reliability test mode that displays the reliability test image including the white image and the black image, the first lighting control signal TEST_GATE_R may have an alternating signal that alternately switches between the turn-on voltage and the turn-off voltage during the period in which the white image is displayed and a direct current signal that maintains the turn-off voltage during the period in which the black image is displayed.

The second lighting control pad 175 receives a second lighting control signal TEST_GATE_B that includes a turn-on voltage and a turn-off voltage for the (3k−1)-th lighting transistor ET2 and ET5.

In the lighting test mode, the second lighting control signal TEST_GATE_B alternately switches between the turn-on voltage and the turn-off voltage and is inverted for the first lighting control signal TEST_GATE_R.

In the drive reliability test mode that displays a reliability test image including a white image and a black image, the second lighting control signal TEST_GATE_B may have an alternating signal that alternately switches between the turn-on voltage and the turn-off voltage and inverted for the first lighting control signal TEST_GATE_R. The period for displaying the black image has the turn-off voltage for the (3k−1)-th lighting transistor ET2 and ET5.

The third lighting control pad 176 receives a third lighting control signal TEST_GATE_G that includes a turn-on voltage for turning on the 3k-th lighting transistors ET3 and ET6 and a turn-off voltage for turning off the 3k-th lighting transistors ET3 and ET6.

In the lighting test mode, the third lighting control signal TEST_GATE_G has a direct current signal having the turn-on voltage.

In the drive reliability test mode that displays a reliability test image including a white image and a black image, the third lighting control signal TEST_GATE_G may have a direct current signal that maintains the turn-on voltage during the period in which the white image is displayed and a direct current signal that maintains the turn-off voltage during the period in which the black image is displayed.

Figure 3:
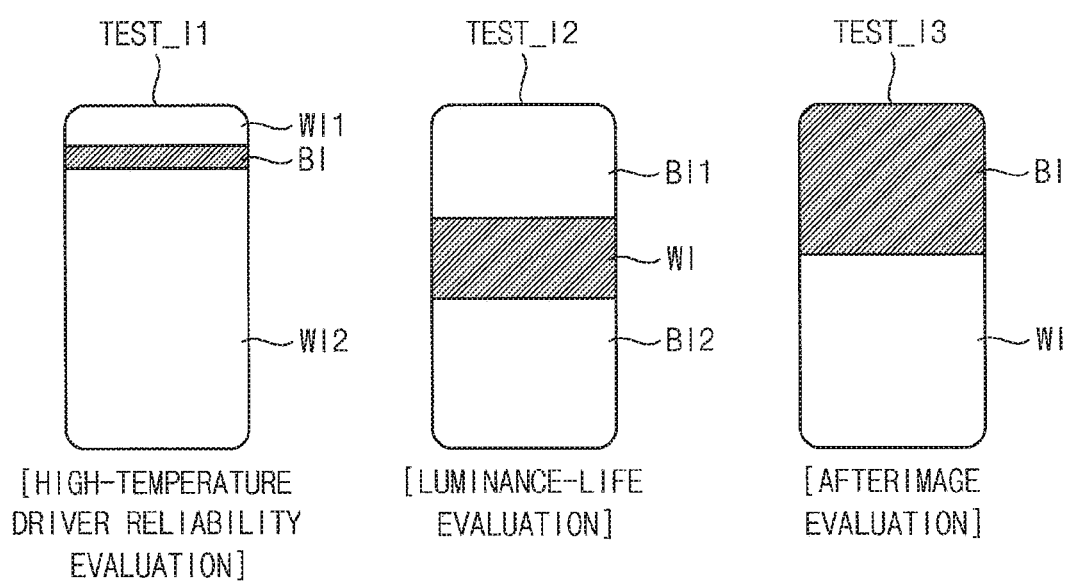
FIG. 3 is a conceptual diagram illustrating a reliability test image for a drive reliability test according to one exemplary embodiment.

FIG. 3 is a conceptual diagram illustrating a reliability test image for a drive reliability test according to one exemplary embodiment.

Referring to FIGS. 1 and 3, in the drive reliability test mode, the reliability test image is displayed on the display part.

The reliability test image may include a first reliability test image TEST_I1 for a high-temperature drive reliability evaluation, a second reliability test image TEST_I2 for a luminance-life evaluation, and a third reliability test image TEST_I2 for an afterimage evaluation.

The first reliability test image TEST_I1 is an image in which a black horizontal line is displayed on a white screen. The second reliability test image TEST_I2 is an image in which a first black image BI1 is displayed in an upper portion, a white image WI is displayed in a center portion, and a second black image BI2 is displayed in a lower portion. The third reliability test image TEST_I3 is an image in which a black image BI is displayed in the upper portion and a white image WI is displayed in the lower portion.

As described above, the reliability test image may include a black image and a white image, however, in other embodiments any suitable test images may be utilized, as would be appreciated by those skilled in the art.

Figure 4:
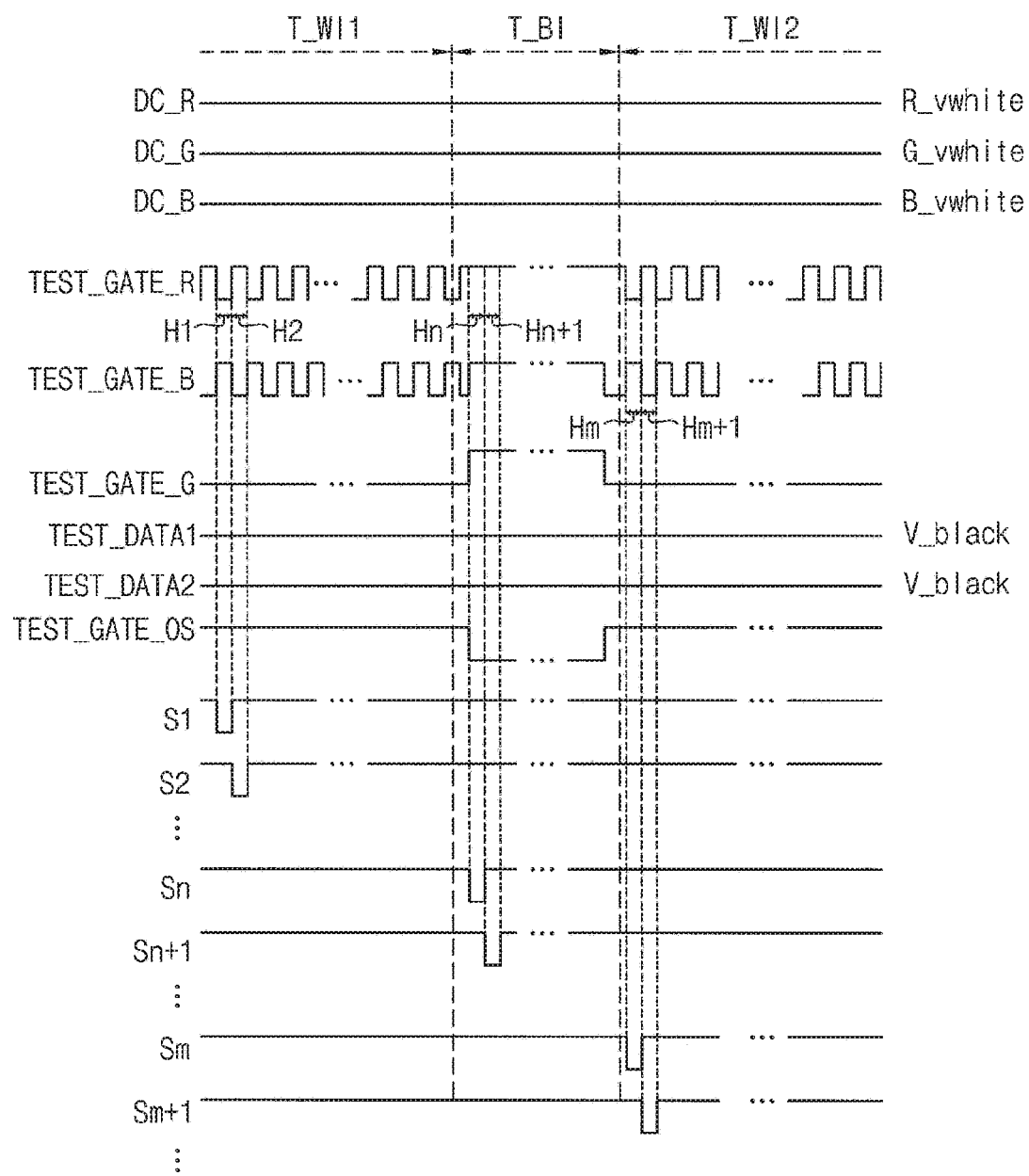
FIG. 4 is a waveform diagram illustrating a drive reliability test mode of a display cell according to one exemplary embodiment.

FIG. 4 is a waveform diagram illustrating a drive reliability test mode of a display cell according to one exemplary embodiment.

Referring to FIGS. 2 and 4, the inspection controller 210 controls the test signal generator 230 to generate a test signal to display a reliability test image for a drive reliability test.

For example, the inspection controller 210 controls the test signal generator 230 to generate a test signal for displaying the first reliability test image TEST_I1 on the display cell for the high-temperature drive reliability test shown in FIG. 3.

The test signal generator 230 generates a plurality of array data signals TEST_DATA1 and TEST_DATA2 and an array control signal TEST_GATA_OS corresponding to the first reliability test image TEST_I1 to provide the first test signal output part 240.

The plurality of array data signals TEST_DATA1 and TEST_DATA2 are direct current signals that maintain a black data voltage V_black corresponding to the black grayscale level. The array control signal TEST_GATA_OS will be described with reference to the waveform diagram shown in FIG. 5.

The test signal generator 230 generates a plurality of lighting data signals DC_R, DC_B and DC_G and a plurality of lighting control signals TEST_GATE_R, TEST_GATE_B and TEST_GATE_G corresponding to the first reliability test image TEST_I1 to provide the second test signal output part 270.

Although not shown, the test signal generator 230 may generate a scan driving signal, e.g., a start pulse and a plurality of clock signals, for driving the scan driver 190 of the display cell 100. The scan driving signal may be provided to the second test signal output part 270.

In an embodiment, the plurality of lighting data signals DC_R, DC_B, and DC_G are direct current signals that respectively maintain the red, blue, and green data voltages R_Vwhite, B_Vwhite, and G_Vwhite corresponding to the white grayscale level.

The plurality of lighting control signals TEST_GATE_R, TEST_GATE_B, and TEST_GATE_G will be described with reference to the waveform diagram shown in FIG. 4.

The array test pad part 140 of the display cell 100 receives the plurality of array data signals TEST_DATA1 and TEST_DATA2 and array control signal TEST_GATA_OS through the first test signal output part 240.

The lighting test pad part 170 of the display cell 100 receives a plurality of lighting data signals DC_R, DC_B and DC_G and a plurality of lighting control signals TEST_GATE_R, TEST_GATE_B, and TEST_GATE_G through the second test signal output part 270.

Although not shown, the lighting test pad part 170 may also receive the scan driving signal. The scan driving signal is provided to the scan driver 190 so that the scan driver 190 may generate a plurality of scan signals that are provided to a plurality of scan lines.

The first reliability test image TEST_I1 shown in FIG. 3 includes the first white image WI1 displayed in the upper area, the second white image WI2 displayed in the lower area and the black image BI corresponding to the black horizontal line displayed between the first white image WI1 and the second white image WI2.

The frame period in which the first reliability test image TEST_I1 is displayed is divided into a first period T_WI1 in which a first white image WI1 is displayed, a second period T_BI in which a black image BI is displayed, and a third period T_WI2 in which the second white image WI2 is displayed.

Referring to the first period T_WI1 for displaying the first white image WI1, a black data voltage V_black of the black grayscale level as the first and second array data signals TEST_DATA1 and TEST_DATA2 is respectively applied to the first and second array test lines 121 and 122.

An array control signal TEST_GATE_OS with a high voltage that is the turn-off voltage, is applied to the array control line 123.

Thus, the plurality of array transistors AT1, AT2, AT3 and AT4 are turned off in response to the high voltage and the black data voltage V_black of the black grayscale level is blocked from being applied to the plurality of data lines DL1, DL2, DL3 and DL4.

However, red, blue and green data voltages R_Vwhite, B_Vwhite and G_Vwhite of the white grayscale level as the first, second and third lighting data signals DC_R, DC_B and DC_G are applied to the first, second and third lighting test lines 151, 152 and 153, respectively. The red, blue and green data voltages R_Vwhite, B_Vwhite and G_Vwhite may have different levels or the same level.

Referring to the first horizontal period H1 of the first period T_WI1, the first lighting control signal TEST_GATE_R with a low voltage is applied to the first lighting control line 154, a second lighting control signal TEST_GATE_B with a high voltage is applied to the second lighting control line 155 and a third lighting control signal TEST_GATE_G with the low voltage is applied to the third lighting control line 156.

Thus, the (3k−2)-th lighting transistors ET1 and ET4 connected to the first lighting control line 154 are turned on in response to the low voltage, and the red data voltage R_Vwhite having the white grayscale level is applied to the first data line DL1 and the third data line DL3.

In addition, the (3k−1)-th lighting transistors ET2 and ET5 connected to the second lighting control line 155 are turned off in response to the high voltage. The blue data voltage B_Vwhite having the white grayscale level that is the second lighting data signal is blocked from being applied to the first data line DL1 and the third data line DL3.

In addition, the 3k-th lighting transistors ET3 and ET6 connected to the third lighting control line 156 are turned on in response to the low voltage. The green data voltage G_Vwhite having the white grayscale level that is the third lighting data signal is applied to the second data line DL2 and the fourth data line DL4.

In the first horizontal period H1, a first scan signal S1 having the low voltage, which is the turn-on voltage for turning on the switching transistor included in the sub pixel from the scan driver, is applied to the first scan line SL1.

Thus, red and green data voltages of the white grayscale level are applied to the sub pixels connected to the first scan line SL1, for example, the red pixel SP1 and the first green pixel SP3 of the first pixel unit PU1, the red pixel SP1 and the first green pixel SP3 of the second pixel unit PU2.

Referring to the second horizontal period H2 of the first period T_WI1, the first lighting control signal TEST_GATE_R having a high voltage is applied to the first lighting control line 154. A second lighting control signal TEST_GATE_B with a low voltage is applied to the second lighting control line 155. A third lighting control signal TEST_GATE_G with a low voltage is applied to the third lighting control line 156.

Thus, the (3k−2)-th lighting transistors ET1 and ET4 connected to the first lighting control line 154 are turned off in response to the high voltage. The red data voltage R_Vwhite having the white grayscale level that is the first lighting data signal is blocked from being applied to the first data line DL1 and the third data line DL3.

In addition, the (3k−1)-th lighting transistor ET2 and ET5 connected to the second lighting control line 155 are turned on in response to the low voltage, and the blue lighting voltage B_Vwhite having the white grayscale level that is the second lighting data signal is applied to the first data line DL1 and the third data line DL3.

In addition, the 3k-th lighting transistors ET3 and ET6 connected to the third lighting control line 156 are turned on in response to the low voltage. The green data voltage G_Vwhite having the white grayscale level that is the third lighting data signal is applied to the second data line DL2 and the fourth data line DL4.

In the second horizontal period H2, a second scan signal S2 having a low voltage from the scan driver is applied to the second scan line SL2.

Thus, the sub pixels connected to the second scan line SL2, for example, the blue pixel SP2 and the second green pixel SP4 of the first pixel unit PU1 and the blue pixel SP2 and the second green pixel SP4 of the second pixel unit PU2, may receive the green data voltage.

As described above, the first white image WI1 may be displayed on the display part DA of the display cell during the first period T_WI1.

Referring to the second period T_BI in which the black image BI is displayed, the first, second and third lighting control signals TEST_GATE_R, TEST_GATE_B and TEST_GATE_G having high voltages are applied to the first, second and third lighting control lines 154, 155 and 156.

Accordingly, the plurality of lighting transistors ET1, ET2, ET3, ET4, ET5 and ET6 are turned off in response to the high voltage and the blue, and green data voltages R_Vwhite, B_Vwhite, and G_Vwhite having the white grayscale level is blocked from being applied to the first, second, and third lighting control lines 154, 155, and 156.

However, the first and second array data signals TEST_DATA1 and TEST_DATA2 having the black data voltage V_black corresponding to the black grayscale level are applied to the first and second array test lines 121 and 122, respectively.

The array control signal TEST_GATE_OS of a low voltage is applied to the array control line 123.

Accordingly, the plurality of array transistors AT1, AT2, AT3 and AT4 are turned on in response to the low voltage, and the black data voltage V_black corresponding to the black grayscale level is applied to the plurality of data lines DL1, DL2, DL3 and DL4.

Referring to the n-th horizontal period Hn of the second period T_BI, an n-th scan signal Sn having a low voltage outputted from the scan driver is applied to the n-th scan line. Therefore, the sub pixels connected to the n-th scan line, for example, the red pixel SP1 and the first green pixel SP3, may receive the black data voltage V_black having the black grayscale level.

Referring to an (n+1)-th horizontal period Hn+1 of the second period T_BI, (n+1)-th scan signal Sn+1 having the low voltage is applied to the (n+1)-th scan line from the scan driver. Accordingly, the sub pixels connected to the (n+1)-th scan line, for example, the blue pixel SP2 and the second green pixel SP4, may receive the black data voltage V_black having the black grayscale level.

As described above, during the second period T_BI for displaying the black image, the plurality of lighting control signals TEST_GATE_R, TEST_GATE_B, and TEST_GATE_R are maintained at the turn-off voltage. By maintaining only the array control signal TEST_GATE_OS at the turn-on voltage, only the black data voltage having the black grayscale level may be applied to the plurality of data lines.

During the second period T_BI, a black image BI may be displayed on the display part DA of the display cell.

Referring to the third period T_WI2, a black data voltage V_black having the black grayscale level is applied to the first and second array test lines 121 and 122, respectively.

The array control signal TEST_GATE_OS with a high voltage of the turn-off voltage is applied to the array control line 123. Thus, the plurality of array transistors AT1, AT2, AT3 and AT4 are turned off in response to the high voltage. The black data voltage V_black corresponding to the black grayscale level is blocked from being applied to the plurality of data lines DL1, DL2, DL3 and DL4. However, red, blue and green data voltages of white grayscale level R_Vwhite, B_Vwhite and G_Vwhite are applied to the first, second and third lighting test lines 151, 152 and 153, respectively.

Referring to the m-th horizontal period Hm of the third period T_WI2, the first lighting control signal TEST_GATE_R having the low voltage is applied to the first lighting control line 154. A second lighting control signal TEST_GATE_B with the high voltage is applied to the second lighting control line 155. A third lighting control signal TEST_GATE_G with the low voltage is applied to the third lighting control line 156.

Thus, the (3k−2)-th lighting transistors ET1 and ET4 connected to the first lighting control line 154 are turned on in response to the low voltage. The red data voltage R_Vwhite of the white grayscale level is applied to the first data line DL1 and the third data line DL3.

In addition, the (3k−1)-th lighting transistors ET2 and ET5 connected to the second lighting control line 155 are turned off in response to the high voltage. The blue data voltage B_Vwhite having the white grayscale level that is the second lighting data signal is blocked from being applied to the first data line DL1 and the third data line DL3.

In addition, the 3k-th lighting transistors ET3 and ET6 connected to the third lighting control line 156 are turned on in response to the low voltage. The green data voltage G_Vwhite having the white grayscale level that is the third lighting data signal is applied to the second data line DL2 and the fourth data line DL4.

In the m-th horizontal period Hm, an m-th scan signal Sm having the low voltage is applied to the m-th scan line from the scan driver.

Thus, sub pixels connected to the m-th scan line, for example, the red pixel SP1 and the first green pixel SP3, may receive the red and green data voltages having the white grayscale level.

Referring to an (m+1)-th horizontal period (Hm+1)-th of the third period T_WI2, the first lighting control signal TEST_GATE_R having the high voltage is applied to the first lighting control line 154. A second lighting control signal TEST_GATE_B with the low voltage is applied to the second lighting control line 155. A third lighting control signal TEST_GATE_G with the low voltage is applied to the third lighting control line 156.

Thus, the (3k−2)-th lighting transistors ET1 and ET4 connected to the first lighting control line 154 are turned off in response to the high voltage. The red data voltage R_Vwhite having the white grayscale level that is the first lighting data signal is blocked from being applied to the first data line DL1 and the third data line DL3.

In addition, the (3k−1)-th lighting transistors ET2 and ET5 connected to the second lighting control line 155 are turned on in response to the low voltage and the blue data voltage B_Vwhite of the second lighting data signal white grayscale level is applied to the first data line DL1 and the third data line DL3.

In addition, the 3k-th lighting transistors ET3 and ET6 connected to the third lighting control line 156 are turned on in response to the low voltage and the green data voltage G_Vwhite having the white grayscale level that is the third lighting data signal is applied to the second data line DL2 and the fourth data line DL4.

The (m+1)-th scan signal Sm+1 having the low voltage is applied to the (m+1)-th scan line during the (m+1)-th horizontal period Hm+1.

Thus, the sub pixels connected to the (m+1)-th scan line SLm+1, for example, the blue pixel SP2 and the second green pixel SP4, may receive the blue and green data voltages having the white grayscale level.

Accordingly, during the third period T_WI, the second white image WI2 may be displayed on the display part of the display cell.

As described above, in the display cell state, the drive reliability test may be performed by controlling the array control signal TEST_GATE_OS and the lighting control signals TEST_GATE_R, TEST_GATE_B, and TEST_GATE_G corresponding to the reliability test image to display the reliability test image on the display cell.

Hereinafter, the same reference numerals may be used to refer to the same components or parts and the repeated descriptions may be omitted.

Figure 5:
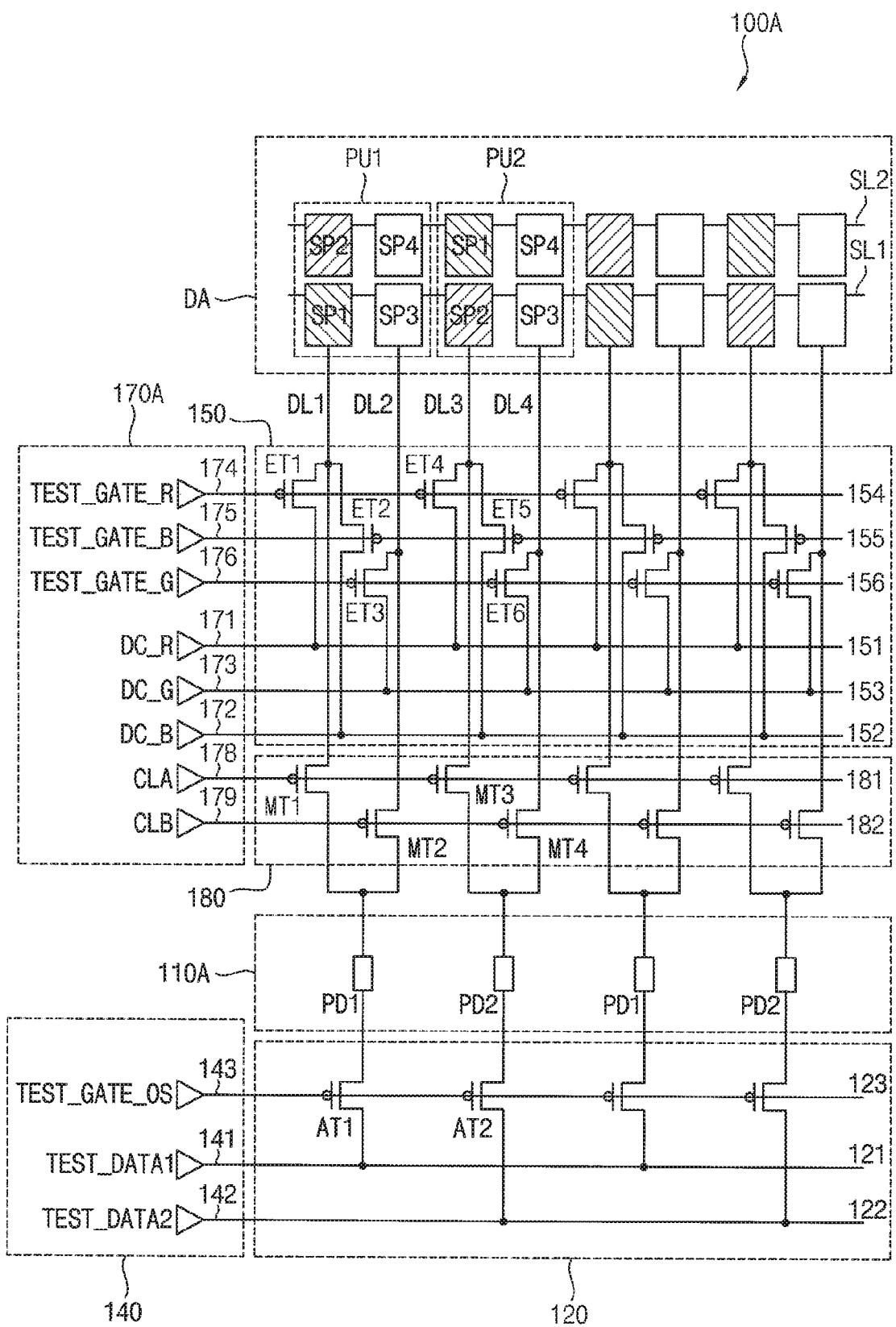
FIG. 5 is a conceptual diagram illustrating a display cell according to one exemplary embodiment.

FIG. 5 is a conceptual diagram illustrating a display cell according to one exemplary embodiment.

Referring to FIG. 5, the display cell 100A may include a display part DA, a fan-out part 110A, an array test part 120, an array test pad part 140, a lighting test part 150, a lighting test pad part 170A and selection controller 180.

According to an exemplary embodiment, the fan-out part 110A, the array test part 120, the array test pad part 140, the lighting test part 150, the lighting test pad part 170A and the selection controller 180 are disposed in the first peripheral area PA1 of the display cell 100 shown in FIG. 1.

The lighting test part 150 is disposed adjacent to the display part DA, the selection controller 180 is disposed adjacent to the lighting test part 150, the fan-out part 110A is disposed adjacent to the selection controller 180, and the array test part 120 is disposed adjacent to the fan-out part 110A.

The lighting test pad part 170A is disposed adjacent to the lighting test part 150 and the array test pad part 140 is disposed adjacent to the array test part 120.

A cutting part may be disposed between the lighting test part 150 and the lighting test pad part 170A, and between the array test part 120 and the array test pad part 140.

The display part DA may include a plurality of pixel units PU1 and PU2.

The display part DA includes the first pixel unit PU1 and the second pixel unit PU2 adjacent to the first pixel unit PU1 in the scan line direction.

The fan-out part 110A is disposed between the array test part 120 and the lighting test part 150. The fan-out part 110A includes a plurality of data pads PD1 and PD2 respectively connected to two adjacent data lines of the plurality of data lines DL1, DL2, DL3 and DL4.

For example, the first data pad PD1 is connected to the first data line DL1 and the second data line DL2, and the second data pad PD2 is connected to the third data line DL3 and the fourth data line DL4.

The array test part 120 includes a first array test line 121, a second array test line 122, an array control line 123 and a plurality of array transistors AT1 and AT2.

The second array test line 122 transmits the second array data signal TEST_DATA2 to the third and fourth data lines DL3 and DL4 connected to an even-numbered pixel unit PU2.

The array control line 123 transmits an array control signal TEST_GATE_OS, which includes a turn-on voltage and a turn-off voltage to turn on and turn off the plurality of array transistors AT1, AT2, AT3 and AT4.

The first array transistor AT1 includes a control electrode connected to the array control line 123, a first electrode connected to the first array test line 121, and a second electrode connected to the first data pad PD1.

The second array transistor AT2 includes a control electrode connected to the array control line 123, a first electrode connected to the second array test line 122, and a second electrode connected to the second data pad PD2.

The array test pad part 140 includes a first array test pad 141, a second array test pad 142, and an array control pad 143, and is connected to a first test signal output part 240 to receive an array test signal.

The lighting test part 150 may include a first lighting test line 151, a second lighting test line 152, a third lighting test line 153, a first lighting control line 154, a second lighting control line 155, a third lighting control line 156 and a plurality of lighting transistors ET1, ET2, ET3, ET4, ET5 and ET6.

The selection controller 180 includes a plurality of selection transistors MT1, MT2, MT3, and MT4, a first selection control line 181 and a second selection control line 182.

The first selection transistor MT1 includes a control electrode connected to the first selection control line 181, a first electrode connected to the first data pad PD1, and a second electrode connected to the odd-numbered data line DL1. The third selection transistor MT3 includes a control electrode connected to the first selection control line 181, a first electrode connected to the second data pad PD2, and a second electrode connected to the odd-numbered data line DL3.

The second selection transistor MT2 includes a control electrode connected to the second selection control line 182, a first electrode connected to the first data pad PD1, and a second electrode connected to the even-numbered data line DL2. The fourth selection transistor MT4 includes a control electrode connected to the second selection control line 182, a first electrode connected to the second data pad PD2, and a second electrode connected to the even-numbered data line DL4

The first selection control line 181 transmits a first selection control signal CLA that includes a turn-on voltage and a turn-off voltage that turns on and turns off the first selection transistor MT1 and the third selection control transistor MT3.

The second selection control line 182 transmits a second selection control signal CLB that includes a turn-on voltage and a turn-off voltage that turns on and a turns off the second selection transistor MT2 and the fourth selection control transistor MT4.

The lighting test pad part 170A may include a first light test pad 171, a second light test pad 172, a third light test pad 173, a first lighting control pad 174, a second lighting control pad 175, a third lighting control pad 176, a first selection control pad 178 and a second selection control pad 179.

The first selection control pad 178 receives the first selection control signal CLA. The first selection control signal CLA may be set differently in the array test mode and the driver reliability mode.

The second selection control pad 179 receives the second selection control signal CLB. The second selection control signal CLB may be set differently in the array test mode and the drive reliability mode.

For example, in the array test mode, the first and second selection control signals CLA and CLB may be direct current signals that maintain a low voltage as the turn-on voltage.

The first and second selection transistors MT1 and MT2 are turned on in response to the turn-on voltage of CLA and CLB. In response to the array control signal TEST_GATE_OS received from the array test pad part 140, the array data signals TEST_DATA1 and TEST_DATA2 may be applied to the plurality of data lines DL1, DL2, DL3 and DL4.

In the lighting test mode, the first and second selection control signals CLA and CLB may be direct current signals that maintain a high voltage that is a turn-off voltage.

In response to the turn-off voltage of the first and second selection control signals CLA and CLB, the first and second selection transistors MT1 and MT2 are turned off. The array data signals TEST_DATA1 and TEST_DATA2 received from the array test pad part 140 are blocked from being applied to the plurality of data lines DL1, DL2, DL3 and DL4.

In addition, in response to the lighting control signals DC_R, DC_B, and DC_G received from the lighting test pad part 170A, the lighting data signals TEST_GATE_R, TEST_GATE_B, and TEST_GATE_G may be applied to the plurality of data lines DL1, DL2, DL3, and DL4.

Figure 6:
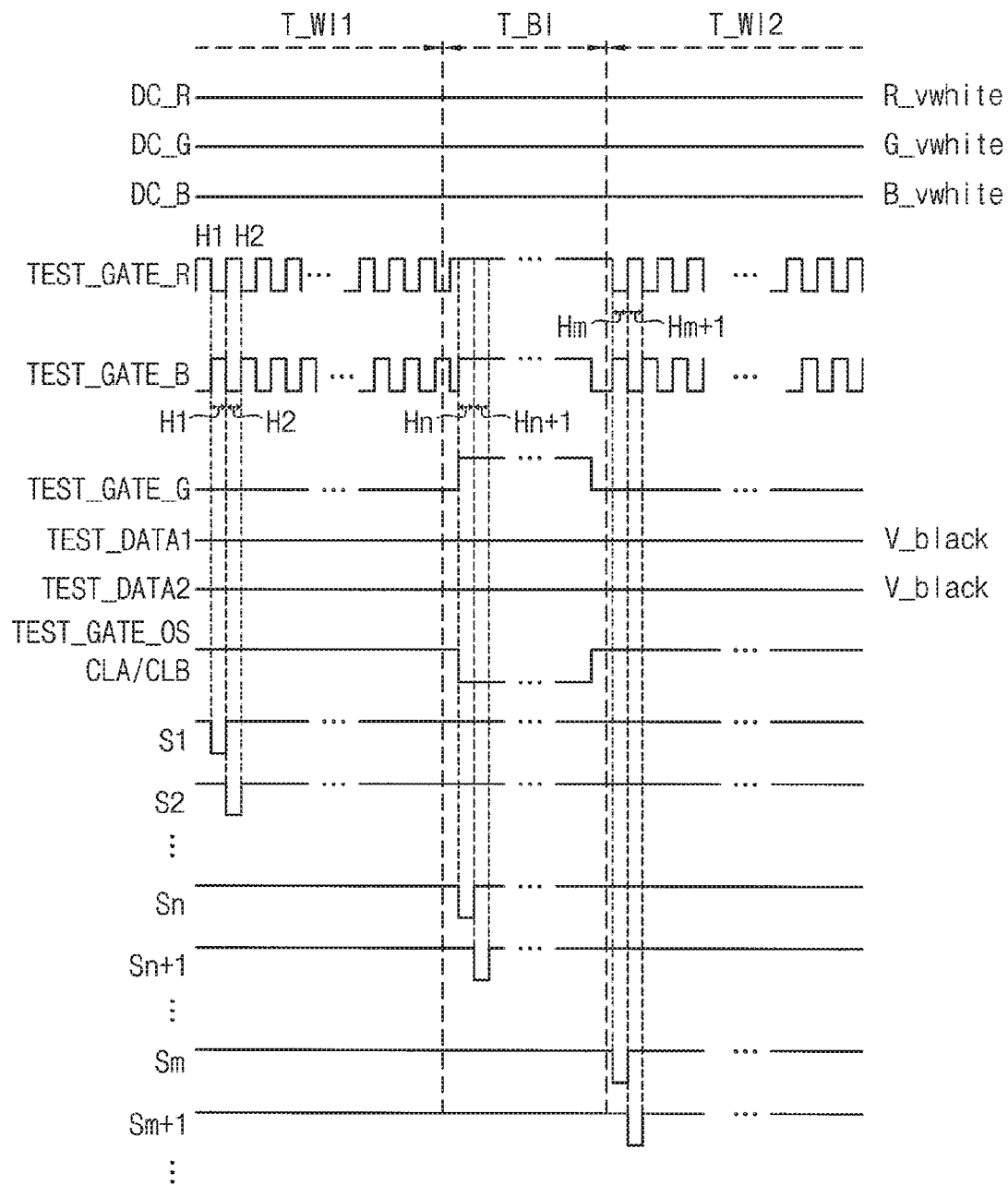
FIG. 6 is a waveform diagram illustrating a drive reliability test mode of a display cell according to one exemplary embodiment.

FIG. 6 is a waveform diagram illustrating a drive reliability test mode of a display cell according to one exemplary embodiment.

Referring to FIGS. 5 and 6, the drive reliability test mode of the display cell may be similar to the drive reliability test mode of the display cell described with reference to FIG. 4, the remaining test signals except for the first and second selection control signals CLA and CLB are substantially the same and thus the repeated description will be omitted.

The frame period in which the first reliability test image TEST_I1 is displayed includes a first period T_WI1 in which a first white image WI1 is displayed, a second period T_BI in which a black image BI is displayed, and a third period T_WI2 in which a second white image WI2 is displayed.

Referring to the first period T_WI1 and the third period T_WI2 in which the first white image WI1 and the second white image WI2 are displayed, the first and second selection control signals CLA and CLB have a direct current signal that maintains a high voltage, which is the turn-off voltage.

The first and second selection transistors MT1 and MT2 are turned off in response to the turn-off voltage of the first and second selection control signals CLA and CLB, and the array data signals TEST_DATA1 and TEST_DATA2 are blocked from being applied to the plurality of data lines DL1, DL2, DL3 and DL4.

However, the red, blue and green data voltages R_Vwhite, B_Vwhite and G_Vwhite having the white grayscale level that are lighting data signals TEST_GATE_R, TEST_GATE_B and TEST_GATE_G may be applied to the plurality of data lines DL1, DL2, DL3 and DL4 in response to the lighting control signals DC_R, DC_B, DC_G received from the lighting test pad part 170.

The red, blue and green data voltages R_Vwhite, B_Vwhite and G_Vwhite of the white grayscale level may be applied to red pixel, blue pixel, first green pixel and second green pixels of the pixel unit in response to the scan signals having the low voltage provided from the scan driver.

As described above, during the first period T_WI1 and the third period T_WI2, the first white image WI1 and the second white image WI2 may be displayed on the display part DA of the display cell.

Referring to the second period T_BI in which the black image BI is displayed, the first and second selection control signals CLA and CLB have a direct current signal that maintains a low voltage which is the turn-on voltage.

The first and second selection transistors MT1 and MT2 are turned on in response to the turn-on voltage of the first and second selection control signals CLA and CLB. In response to the low voltage of the array control signal TEST_GATE_OS, the black data voltages V_black that are the array data signals TEST_DATA1 and TEST_DATA2 may be applied to the plurality of data lines DL1, DL2, DL3 and DL4.

The black data voltage V_black having the black grayscale level may be applied to red pixel, blue pixel, first green pixel and second green pixels of the pixel unit in response to the scan signals having the low voltage provided from the scan driver.

However, the plurality of lighting transistors ET1, ET2, ET3, ET4, ET5 and ET6 are turned off in response to the first, second and third lighting control signals TEST_GATE_R, TEST_GATE_B and TEST_GATE_G having the high voltage. The red, blue and green data voltages R_Vwhite, B_Vwhite and G_Vwhite having the white grayscale level are not applied to the first, second, third and fourth data lines DL1, DL2, DL3 and DL4.

As described above, during the second period T_BI in which the black image is displayed, the plurality of lighting control signals TEST_GATE_R, TEST_GATE_B, and TEST_GATE_R are maintained at the turn-off voltage. The array control signal TEST_GATE_OS and selection control signals are maintained at the turn-off voltage and thus the black data voltage of the black grayscale level may be applied to the plurality of data lines. During the second period T_BI, a black image BI may be displayed on the display part of the display cell.

Although described above with reference to the displaying of the first reliability test image TEST_I1, a similar methodology may be used to display the second reliability test image TEST_I2 which includes two black images and one white image, and the third reliability test image TEST_I3, which includes one black image and one white image.

Figure 7:
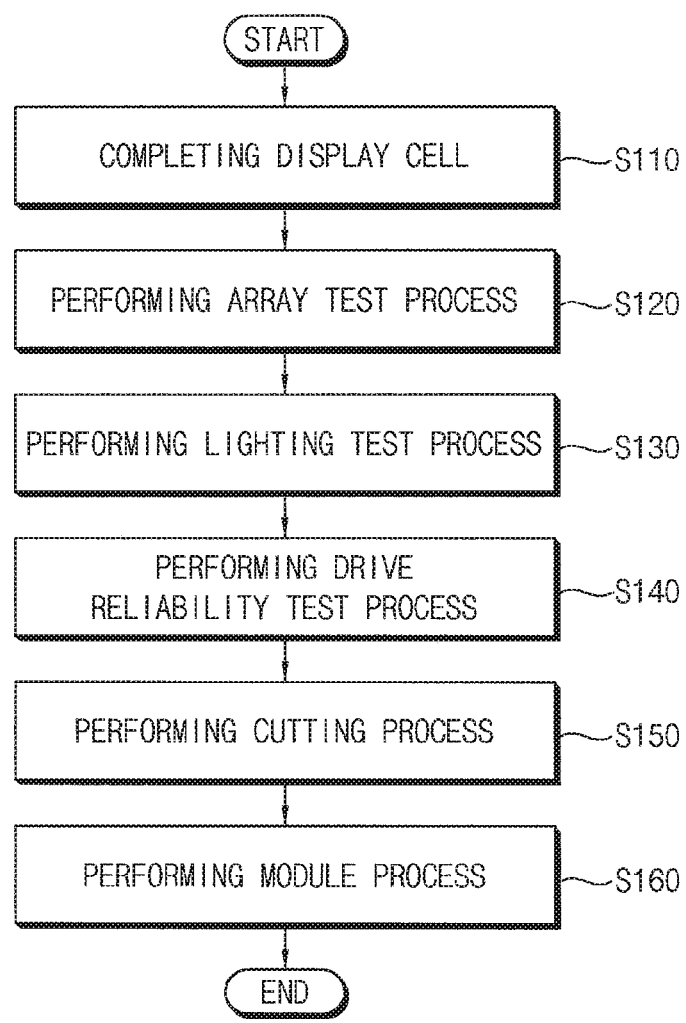
FIG. 7 is a flowchart diagram illustrating a method of manufacturing an organic light-emitting display according to one exemplary embodiment.
Figure 8:
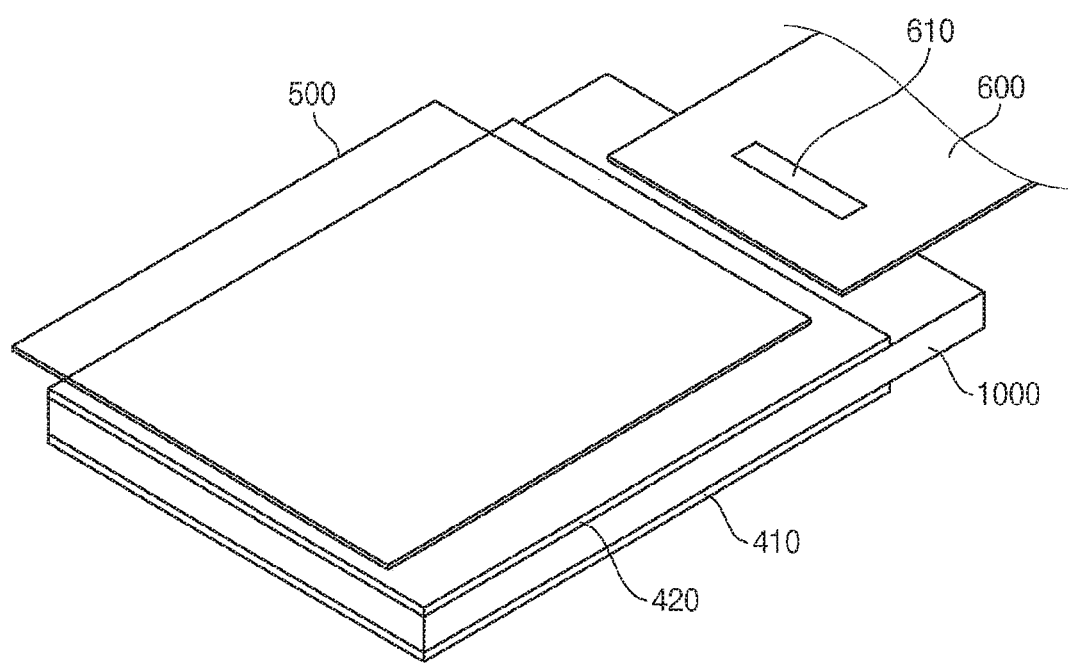
FIG. 8 is a perspective view illustrating an organic light-emitting display after a module process according to one exemplary embodiment.

FIG. 7 is a flowchart diagram illustrating a method of manufacturing an organic light-emitting display according to one exemplary embodiment. FIG. 8 is a perspective view illustrating an organic light-emitting display after a module process according to one exemplary embodiment.

Referring to FIGS. 1 and 7, when the display cell 100 is completed as shown in FIG. 1 (Box S110), the inspection apparatus 200 performs the test processes of the display cell 100.

For example, the array test process is performed (Box S120).

The inspection apparatus 200 applies an array data signal and an array control signal to the array test pad array 140 of the display cell 100 through a first test signal output part 240. At this time, the second test signal output part 270 of the inspection apparatus 200 does not output the lighting data signal and the lighting control signal.

The array test process inspects electrical defects of signal lines such as the plurality of data lines and the plurality of gate lines of the display part.

Then, the lighting test process is performed (Box S130).

The inspection apparatus 200 applies a lighting data signal and a lighting control signal to a lighting test pad part 140 of the display cell 100 through a second test signal output part 270. At this time, the first test signal output part 240 of the inspection apparatus 200 does not output the array data signal and the array control signal.

The lighting test process applies the data voltage of a full white grayscale level and inspects whether the pixel unit emits the light having a full white level.

Then, the drive reliability test process is performed (Box S140).

The inspection apparatus 200 generates an array data signal, an array control signal, a lighting data signal, and a lighting control signal corresponding to the set reliability test image (e.g., first reliability test image TEST_I1, the second reliability test image TEST_I2, and/or the third reliability test image TEST_I3). The inspection apparatus 200 applies an array data signal and an array control signal to the array test pad part 140 of the display cell 100 through the first test signal output part 240 and applies the lighting data signal and the lighting control signal to a lighting test pad part 170 of the display cell 100 through a second test signal output part 270.

As described with reference to FIG. 4, in the period in which a white image corresponding to a reliability test image is displayed, the drive reliability test mode includes applying the array control signal of the direct current signal maintaining the turn-off voltage to the array test pad part 140 and applying the first and second lighting control signals of the alternating signals alternating between the turn-on voltage and the turn-off voltage to the lighting test pad part 170.

In addition, in the period in which a black image corresponding to a reliability test image is displayed, the drive reliability test mode includes applying the array control signal of the direct current signal maintaining the turn-on voltage to the array test pad part 140 and applying the first and second lighting control signals of the direct current signals maintaining the turn-off voltage to the lighting test pad part 170.

Therefore, the inspection apparatus 200 may perform a drive reliability test by displaying the reliability test image on the display part of the display cell 100.

As the described above, the array test process, the lighting test process and the drive reliability test process may be performed in the display cell state.

After the array test process, the lighting test process and the drive reliability test process are completed, a cutting process of the display cell 100 is preformed (Box S150). The cutting process includes cutting the first and second cutting parts 130 and 160 of the display cell 100 shown in FIG. 1 and thus, between the array test part 120 and the array test pad part 140 and between the lighting test part 150 and the lighting test pad part 170 are electrically and/or physically separated.

Referring to FIGS. 7 and 8, after the cutting process, a module process is performed (Box S160). The module process includes adhering at least one of polarizing plates 410 and 420, a protective film 500 and a flexible circuit board 600 including a driver chip to a display panel 1000.

According to the exemplary embodiments, in the display cell state, the drive reliability test is performed using the array test signal and the lighting test signal, thereby simplifying the inspection process and reducing the manufacturing cost.

The present inventive concept may be applied to a display device and an electronic device having the display device. For example, embodiments of the present inventive concept may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

The foregoing is illustrative of the present inventive concept and is not to be construed as limiting thereof. Although a few exemplary embodiments of the present inventive concept have been described, those skilled in the art will readily appreciate that many modifications are possible in the exemplary embodiments without materially departing from the novel teachings and features of the inventive concept. Accordingly, all such modifications are intended to be included within the scope of the inventive concept as defined in the claims and their equivalents. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. An inspection system for a display cell comprising a display part comprising a first pixel unit and a second pixel unit adjacent to the first pixel unit and a plurality of data lines connected to the first and second pixel units, an array test part in a peripheral area around the display part and configured to provide the plurality of data lines with an array data signal based on an array control signal, and a lighting test part in the peripheral area and configured to provide the plurality of data lines with a lighting data signal based on a lighting control signal, the inspection system comprising:
   an inspection apparatus configured to provide the array test part with an array control signal to block the array data signal from being applied to the plurality of data lines in a period in which a white image is displayed and to provide the lighting test part with a lighting control signal to block the lighting data signal from being applied to the plurality of data lines during a period in which a black image is displayed, during a drive reliability test mode for displaying a test image including the black image and the white image.

2. The inspection system of claim 1, wherein each of the first pixel unit and the second pixel unit comprises a first sub-pixel, a second sub-pixel, a third sub-pixel and a fourth sub-pixel,
   wherein the first and second sub-pixels of the first pixel unit are connected to a first data line and the third and fourth sub-pixels of the first pixel unit are connected to a second data line, and
   the first and second sub-pixels of the second pixel unit are connected to a third data line, and the third and fourth sub-pixels of the second pixel unit are connected to a fourth data line.

3. The inspection system of claim 2, wherein the array test part comprises:
   an array control line configured to transfer an array control signal;
   a first array test line configured to transfer a first array data signal;
   a second array test line configured to transfer a second array data signal;
   first and second array transistors configured to transfer the first array data signal to the first and second data lines in response to the array control signal; and
   third and fourth array transistors configured to transfer the second array data signal to the third and fourth data lines in response to the array control signal.

4. The inspection system of claim 3, wherein the first sub-pixel is configured to emit light having a first color of light, the second sub-pixel is configured to emit light having a second color of light, and the third and fourth sub-pixels are configured to emit light having third color.

5. The inspection system of claim 3, wherein the lighting test part comprises:
   a first lighting control line configured to transfer a first lighting control signal;
   a second lighting control line configured to transfer a second lighting control signal;
   a third lighting control line configured to transfer a third lighting control signal;
   a first lighting test line configured to transfer a first lighting data signal;

a second lighting test line configured to transfer a second lighting data signal;

a third lighting test line configured to transfer a third lighting data signal;

a first lighting transistor configured to transfer the first lighting data signal to the first data line in response to the first lighting control signal;

a second lighting transistor configured to transfer the second lighting data signal to the first data line in response to the second lighting control signal; and a third lighting transistor configured to transfer the third lighting data signal to the second data line in response to the third lighting control signal.

6. The inspection system of claim 5, wherein in a period for displaying the white image, the array control signal maintains a turn-off voltage for turning off the array transistors, the first lighting control signal alternately repeats a turn-on voltage for turning on the first lighting transistor and a turn-off voltage for turning off the first lighting transistor, the second lighting control signal alternately repeats the turn-on voltage and the turn-off voltage opposite to the first lighting control signal, and the third lighting control signal maintains the turn-on voltage.

7. The inspection system of claim 6, wherein in a period displaying the black image, the array control signal maintains the turn-on voltage for turning on the array transistors, and the first, second and third lighting control signals maintain the turn-off voltage for turning off the lighting transistors.

8. The inspection system of claim 6, wherein the array data signal is a black data voltage of a black grayscale level, and the first, second and third lighting data signals are different color data voltages of a white grayscale level.

9. The inspection system of claim 6, further comprising:

a fan-out part in the peripheral area of the display cell between the array test part and the lighting test part and having a plurality of data pads connected to a plurality of data lines; and a selection control part between the fan-out part and the lighting test part.

10. The inspection system of claim 9, wherein the selection control part comprises:

a first selection control line configured to receive a first selection control signal from the inspection system;

a second selection control line configured to receive a second selection control signal from the inspection system;

a first selection transistor configured to connect a data pad to an odd-numbered data line in response to the first selection control signal; and a second selection transistor configured to connect the data pad to an even-numbered data line in response to the second selection control signal.

11. The inspection system of claim 10, wherein in the period for displaying the white image, the first and second selection control signals maintain a turn-off voltage for turning off the selection transistors.

12. The inspection system of claim 11, wherein in a period displaying the black image, the first and second selection control signals maintain a turn-on voltage for turning on the first and second selection transistors.

13. The inspection system of claim 11, further comprises:

an array test pad part configured to receive the array control signal, a first array test signal, and a second array test signal;

a lighting test pad part configured to receive the first, second, and third lighting control signals and the first, second, and third lighting data signals; and a cutting part between the array test part and the array test pad part and between the lighting test part and the lighting test pad part.

14. A method of inspecting a display cell which comprises a display part including a first pixel unit and a second pixel unit adjacent to the first pixel unit and a plurality of data lines connected to the first and second pixel units, an array test part in a peripheral area around the display part and configured to provide the plurality of data lines with an array data signal based on an array control signal, and an lighting test part in the peripheral area and configured to provide the plurality of data lines with a lighting data signal based on a lighting control signal, the method comprising:

in a drive reliability test mode for displaying a test image including a black image and a white image, providing the array test part with an array control signal to block the array data signal from being applied to the plurality of data lines in a period in which the white image is displayed; and providing the lighting test part with a lighting control signal to block the lighting data signal from being applied to the plurality of data lines in a period in which the black image is displayed.

15. The method of claim 14, further comprising:

applying the lighting data signal to the plurality of data lines in a period for displaying the white image; and applying the array data signal to the plurality of data lines in a period for displaying the black image.

16. The method of claim 14, wherein the array test part comprises an array control line configured to transfer an array control signal, a first array test line configured to transfer a first array data signal, a second array test line configured to transfer a second array data signal, first and second array transistors configured to transfer the first array data signal to first and second data lines in response to the array control signal, and third and fourth array transistors configured to transfer the second array data signal to third and fourth data lines in response to the array control signal, wherein in a period for displaying the white image, the array control signal maintains a turn-off voltage for turning off the first, second, third, and fourth array transistors, and in a period for displaying the black image, the array control signal maintains a turn-on voltage for turning on the first, second, third, and fourth array transistors.

17. The method of claim 16, wherein a first sub-pixel is configured to emit light having a first color, a second sub-pixel is configured to emit light having a second color, and third and fourth sub-pixels are configured to emit light having a third color.

18. The method of claim 17, wherein the lighting test part comprises a first lighting control line configured to transfer a first lighting control signal, a second lighting control line configured to transfer a second lighting control signal, a third lighting control line configured to transfer a third lighting control signal, a first lighting test line configured to transfer a first lighting data signal, a second lighting test line configured to transfer a second lighting data signal, a third lighting test line configured to transfer a third lighting data signal, a first lighting transistor configured to transfer the first lighting data signal to the first data line in response to the first lighting control signal, a second lighting transistor configured to transfer the second lighting data signal to the first data line in response to the second lighting control signal, and a third lighting transistor configured to transfer the third lighting data signal to the second data line in response to the third lighting control signal,
- wherein in the period for displaying the white image, the first lighting control signal alternately repeats a turn-on voltage for turning on the first lighting transistor and a turn-off voltage for turning off the first lighting transistor, the second lighting control signal alternately repeats the turn-on voltage and the turn-off voltage opposite to the first lighting control signal, and the third lighting control signal maintains the turn-on voltage, and
- wherein in the period for displaying the black image, the first, second and third lighting control signals maintain the turn-off voltage for turning off the lighting transistors.

19. The method of claim 16, wherein in an array test mode, the array control signal maintains the turn-on voltage for turning on the array transistors, and
- the plurality of data lines to receive the first and second array data signals by turning on the array transistors.

20. The method of claim 16, wherein in a lighting test mode, a first lighting control signal alternately repeats the turn-on voltage for turning on a lighting transistor and the turn-off voltage for turning off the lighting transistor, a second lighting control signal alternately repeats the turn-on voltage and the turn-off voltage opposite to the first lighting control signal, and a third lighting control signal maintains the turn-on voltage, and
- the plurality of data lines receives first, second and third lighting data signals by turning on first, second and third lighting transistors.

* * * * *